United States Patent [19]

Adair et al.

[11] Patent Number: 4,587,194
[45] Date of Patent: May 6, 1986

[54] PHOTOSENSITIVE MATERIAL EMPLOYING MICROCAPSULES HAVING DIFFERENT PHOTOGRAPHIC SPEEDS

[75] Inventors: Paul C. Adair; Chuan Lee; Frank D. Loel, all of Chillicothe, Ohio

[73] Assignee: The Mead Corporation, Dayton, Ohio

[21] Appl. No.: 673,293

[22] Filed: Nov. 20, 1984

[51] Int. Cl.⁴ .......................... B05D 7/00; G03C 1/46; G03C 1/72; G03C 5/00
[52] U.S. Cl. .................................... 430/138; 427/221; 427/222; 430/394; 430/502
[58] Field of Search .................. 430/502, 138, 394; 427/221, 222

[56] References Cited

U.S. PATENT DOCUMENTS

| T882,024 | 1/1971 | Feldman | 96/45.2 |
|---|---|---|---|
| 3,505,068 | 4/1970 | Beckett et al. | 96/68 |
| 3,516,831 | 6/1970 | Wolf et al. | 430/502 |
| 3,697,272 | 10/1972 | Raminus | 430/394 X |
| 4,308,807 | 4/1985 | Adair | 430/138 |
| 4,373,018 | 2/1983 | Reichmanis et al. | 430/394 X |
| 4,489,151 | 12/1984 | Sanders et al. | 430/138 |
| 4,501,809 | 2/1985 | Hiraishi et al. | 430/138 |

FOREIGN PATENT DOCUMENTS

| 0125735 | 10/1981 | Japan | 430/394 |
|---|---|---|---|
| 0078148 | 5/1983 | Japan | 430/270 |

Primary Examiner—John E. Kittle
Assistant Examiner—Mukund J. Sham
Attorney, Agent, or Firm—Biebel, French & Nauman

[57] ABSTRACT

An imaging material and process employing photosensitive microcapsules useful in forming two or more image colors by exposure with an intensity or time modulated radiation source such as a laser; the imaging material comprises a support having at least two sets of photosensitive microcapsules on the surface, one set of microcapsules is made up of high speed microcapsules which are more sensitive to a predetermined actinic radiation than a second set of microcapsules made up of lower speed microcapsules; the microcapsules include a photosensitive composition which undergoes a change in viscosity upon exposure to actinic radiation; first and second image-forming agents are respectively associated with each set of microcapsules; the imaging material is useful in forming images of two or more colors by a process which comprises image-wise exposing the imaging material to actinic radiation at a first exposure amount which is substantially quantitatively different than the second exposure amount, and subjecting the exposed imaging material to a uniform rupturing force such as pressure.

33 Claims, 2 Drawing Figures

PHOTOSENSITIVE MATERIAL EMPLOYING MICROCAPSULES HAVING DIFFERENT PHOTOGRAPHIC SPEEDS

BACKGROUND OF THE INVENTION

The present invention relates to imaging materials of the type which employ photosensitive microcapsules and more particularly to imaging materials useful in forming two or more image colors wherein the imaging material carries microcapsules having distinctly different film speeds.

U.S. Pat. Nos. 4,399,209 and 4,440,846 to The Mead Corporation disclose imaging sheets containing photosensitive microcapsules wherein images are formed by image-wise exposing the sheets to actinic radiation and subjecting the sheets to a uniform rupturing force.

SUMMARY OF THE INVENTION

The present invention provides a convenient and inexpensive means for producing two or more image colors wherein an imaging material is provided with microcapsules having distinctly different film speeds such that by exposing at two or more distinctly different intensities or exposure times, i.e., at two or more different exposure amounts, multi-color images can be obtained. In accordance with the present invention, an imaging material is provided with a first set of microcapsules containing a first image-forming agent which is highly sensitive to a given actinic radiation (e.g., ultraviolet radiation or blue light) and a second set of microcapsules containing a second image-forming agent and which, while sensitive to the same predetermined radiation, is less sensitive than the first set of microcapsules.

It has been found that the aforesaid imaging material is an effective two-color imaging material. Where three or more image colors are desired it is possible to design systems with three or more sets of microcapsules having distinctly different film speeds.

Imaging sheets carrying microcapsules having different film speeds yield multi-colored images when exposed to an intensity modulated or time modulated radiation source. The photosensitive materials of the present invention can be positive or negative working. Where the microcapsules contain positive working photohardenable compositions (e.g., compositions containing ethylenically unsaturated compounds), in areas receiving zero exposure each set of microcapsules ruptures and releases the image-forming agent it contains and an image is formed which is a product of the mixture of the image-forming agents. In areas receiving a low exposure amount, the first set of microcapsules is hardened and only the second set ruptures and releases the image-forming agent. In areas of high exposure, all capsules are hardened, none release the image-forming agent and no image is obtained.

Negative working imaging systems can be designed using a photosoftenable material or by incorporating photoactivatable inhibitors in photocurable compositions. In the latter case, negative images are formed by image-wise exposing the imaging sheet to a first radiation at different exposure amounts (modulated exposure) and thereafter uniformly exposing the imaging sheet to a second radiation which hardens the microcapsules in the areas in which the microcapsules are not previously exposed. The first exposure image-wise induces the inhibitor precursor to generate the inhibiting species such that the microcapsules cannot be hardened. The second exposure is one which otherwise causes the microcapsules to harden. No exposure provides no image color; low image-wise exposure enables the high speed microcapsules to rupture and release the image-forming agent; and high image-wise exposure results in both sets of microcapsules rupturing and releasing the image-forming agents.

While the discussion herein will often refer to two color systems, it will be apparent that the teachings of the present invention can be applied to provide three or four color systems as well.

The imaging materials of the present invention are useful in various applications including making engineering drawings and as proofing materials.

Accordingly, a principal object of the present invention is to provide an imaging material useful in producing two or more image colors wherein two or more sets of microcapsules having distinctly different film speeds are used.

DEFINITIONS

The term "microcapsule" as used herein includes microcapsules having a discrete wall as well as open phase systems consisting essentially of a dispersion of a photosensitive composition in a binder.

The term "actinic radiation" includes the entire electromagnetic spectrum as well as particle radiation such as electron beam or ion beam exposure. The radiation most typically used is ultraviolet radiation or blue light (e.g., 350–490 nm).

The term "shoulder speed" means that exposure (ergs/cm$^2$) required to attain a density 90% of maximum. "Toe speed" means that exposure (ergs/cm$^2$) required to attain a density 10% of maximum.

The term "exposure" refers to the total amount of radiation (ergs) incident a given area (1 cm$^2$) of the imaging sheet.

DETAILED DESCRIPTION OF THE INVENTION

Figure 1:
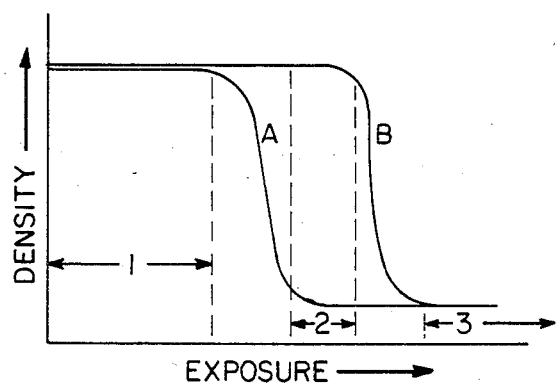
FIG. 1 contains H & D curves for positive working imaging system in accordance with the present invention.

The photosensitive material of the present invention is characterized in that it includes two or more sets of microcapsules having distinctly different film speeds. In accordance with the present invention a difference in total exposure, as opposed to wavelength, controls imaging. Such a relationship is illustrated in FIG. 1 which provides H and D curves for the positive working photosensitive material of Example 1. Density decreases with increasing exposure. Curve A in FIG. 1 corresponds to the high speed microcapsules whereas Curve B corresponds to the slower speed microcapsules. Three exposure zones are shown in FIG. 1 as Zone 1, Zone 2, and Zone 3.

Zone 1 ranges from no exposure to the shoulder of H & D Curve A. The shoulder speed of Curve A is about 1140 ergs/cm$^2$. Microcapsules receiving exposure in Zone 1 are not hardened upon exposure and consequently they release the image-forming agent upon being subjected to a uniform rupturing force. In this case, both sets of microcapsules rupture and release the internal phase and the color of the image area is determined by the mixture of the image-forming agents contained in the microcapsules.

Zone 2 ranges from about the toe of Curve A to about the shoulder of Curve B. The toe speed of Curve A is about 3100 ergs/cm$^2$ and the shoulder speed of Curve B is about 3700 ergs/cm$^2$. In Zone 2, the high speed microcapsules A are hardened and, as such, they do not release the image-forming agent upon development. On the other hand, the less sensitive microcapsules B, are substantially unhardened by an exposure in Zone 2 and they release their contents including the second image-forming agent upon development. Hence, areas receiving an exposure in Zone 2 are the color produced by the second image-forming agent.

Zone 3 extends from the toe of Curve B (about 7850 ergs/cm$^2$) to higher exposure amounts. An exposure in Zone 3 hardens all microcapsules and no color is formed. These areas are background or "non-image" areas.

The preferred means of providing a negative working two-color system utilizes a combination of a photoactivatable inhibitor (precursor) and a photohardenable composition in the microcapsules. Typical examples of such compounds are provided below. These inhibitors or "inhibitor precursors" as they are sometimes called are characterized in that upon exposure they generate a species which is an inhibitor of free radical polymerization. Otherwise they do not greatly inhibit polymerization. Thus, two exposures are required to form images. One exposure generates the inhibitor and the other accomplishes polymerization in the uninhibited areas. In accordance with the present invention, the imaging system is designed such that by modulating the inhibitor-generating exposure two or more image colors can be obtained. This is illustrated in more detail with reference to Table 1 later. As in the case of the positive working system, two or more sets of microcapsules are employed on the photographic support, however, the capsules are designed such that the inhibitors are differ- entially generated by the modulated exposure.

Negative images are formed by image-wise exposing the imaging sheet to a first radiation at different exposure amounts (modulated exposure) and thereafter uniformly exposing the imaging sheet to a second radiation which hardens the microcapsules in the areas in which the microcapsules are not previously exposed. The first exposure image-wise induces the inhibitor precursor to generate the inhibiting species such that the microcapsules cannot be hardened. The second exposure is one which otherwise causes the microcapsules to harden. The imaging mechanism is described in more detail in U.S. Application Ser. No. 618,016, filed June 7, 1984, which is herein incorporated by reference.

Figure 2:
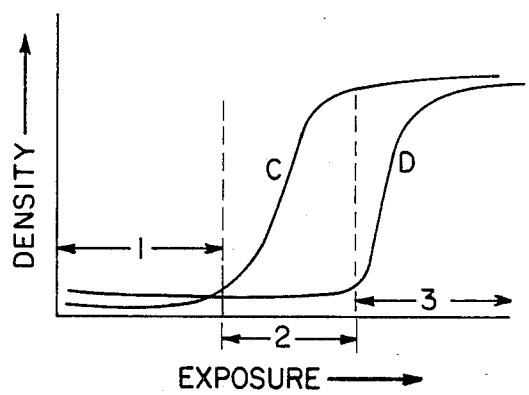
FIG. 2 is the H & D curves for a negative working imaging system in accordance with the invention.

FIG. 2 illustrates the H & D curves for the negative working system of Example 2. Exposure in Zone 1 does not activate the inhibitor to an appreciable extent in either higher speed capsule C or low speed capsule D. Consequently, following uniform exposure, both sets of capsules are hardened and neither releases the image-forming agents.

Exposure in Zone 2 is greater than the toe speed of Capsule C and preferably less than the toe speed of Capsule D. This exposure activates the inhibitor in Capsule C without activating the inhibitor in Capsule D. Thus, following the uniform exposure, the C capsules rupture and release the image-forming agent whereas the D capsules do not. The image is the color of the precursor in the C capsule. An exposure in Zone 3 is an exposure which is capable of activating the inhibitor in both sets of capsules and is preferably greater than the shoulder speed of tne D capsules. In this case, following uniform exposure, both capsules rupture and release the image-forming agents and an image of mixed color is obtained.

The inhibitor controlled imaging system of FIG. 2 is particularly advantageous because it does not have to be used in a negative mode and a variety of different image formats can be achieved by varying the degree of exposure as well as the exposure sequence. This photosensitive material can be used as a positive working material if the inhibitor is not activated.

Table 1 below lists the number of different image formats that can be obtained using a two-color inhibitor controlled imaging system wherein a magenta color precursor is placed in the higher speed microcapsule (C) and a dark green color former system is placed in the lower speed microcapsule (D) (see FIG. 2). In areas in which both sets of capsules release the internal phase, the image is black.

TABLE 1

| | | | | EXPOSURE SEQUENCE, LIGHT SOURCE AND TIME Light Source-Time (sec.) | | |
|---|---|---|---|---|---|---|
| FORMAT NO. | IMAGE A | IMAGE B | BACKGROUND | Exposure(s) With Mask A | Exposure(s) With Mask B | Exposure(s) Without Mask |
| 1 | Magenta | Black | White | UV-25 | UV-90 | Vis-7 |
| 2 | Black | Magenta | White | UV-90 | UV-25 | Vis-7 |
| 3 | Magenta | Magenta | White | UV-25 | UV-25 | Vis-7 |
| 4 | Black | Black | White | UV-90 | UV-90 | Vis-7 |
| 5 | Magenta | Magenta | Black | UV-25 then Vis-7 | UV-25 then Vis-7 | None |
| 6 | Magenta | White | Black | UV-25 then Vis-7 | Vis-7 | None |
| 7 | White | Magenta | Black | Vis-7 | UV-25 then Vis-7 | None |
| 8 | White | White | Black | Vis-7 | Vis-7 | None |
| 9 | Black | Black | Magenta | UV-65 | UV-65 | UV-25 then Vis-7 |
| 10 | Black | White | Magenta | UV-65 | Vis-7 | UV-25 then Vis-7 |
| 11 | White | Black | Magenta | Vis-7 | UV-65 | UV-25 then Vis-7 |
| 12 | White | White | Magenta | Vis-7 | Vis-7 | UV-25 then Vis-7 |

[1]Mask A is the negative of Image A; Mask B is the negative of Image B
UV = ultraviolet radiation (350-390 nm), Vis = visible light (430-490 nm)

Microcapsules having distinct film speeds at a given radiation (wavelength) can be designed using a number of techniques including using different photoinitiator systems and/or photoinitiator concentrations in the photosensitive compositions or by including an absorber in one set of microcapsules to reduce its sensitivity relative to the other set. In particular, film speeds can be varied by using hydrogen donors having different efficiencies in photoinitiator systems that produce free radicals through a hydrogen abstraction. Similarly, the ultraviolet extinction coefficients of color formers vary sufficiently that photographic speed can be varied by the appropriate choice of color formers. Speed can also be controlled by forming the microcapsules from different wall materials, one of which is somewhat more impermeable to oxygen than the other. Alternatively, agents which enhance or reduce film speed can be included in one set of the capsules. Certain inhibitors can be used to reduce film speed. The film speed of negative systems can be varied by using compounds which generate inhibitors of differing efficiency, or using tne inhibitor generating species in different concentrations.

The photosensitive materials of the present invention can be prepared by following the teachings in U.S. Pat. Nos. 4,399,209 and 4,440,846, both of which are incorporated by reference.

The preferred example of photosensitive compositions useful in the present invention are photohardenable compositions, however, photosoftenable compositions can probably also be used. Both types of compositions are known in the art.

A typical example of a photohardenable composition useful in the present invention is ethylenically unsaturated compounds. These compounds contain at least one terminal ethylene group per molecule. Liquid ethylenically unsaturated compounds having two or more terminal ethylene groups per molecule are generally preferred. Examples of this preferred subgroup are ethylenically unsaturated acid esters of polyhydric alcohols such as ethylene glycol dimethacrylate, triethylene glycol dimethacrylate, trimethylolpropane triacrylate (TMPTA), trimethylol propane trimethacrylate, pentaerythritol triacrylate, pentaerythritol trimethacrylate, etc.

A photosoftenable material that may be useful in the invention is 3-oximino-2-butanone methacrylate which undergoes main chain scission upon U.V. exposure, poly 4'-alkyl acylophenones, and certain resins having a quinone diazide residue. See Reichmanis, E.; *Am. Chem. Soc. Div. Org. Coat. Plast. Chem. Prepr.* 1980. 43, 243–251 and Lukac, I.; Chmela S., Int. Conf. on Modif. Polym. 5th. Bratislave, Czech. July 3–6, 1979, I.U.P-.A.C. Oxford, England 1979, 1, 176–182.

Photoinitiators which form free-radicals by homolytic bond clevage after photoexcitation or photoinitiators which generate a free-radical by abstraction of a hydrogen atom from a suitable hydrogen donor upon photoexcitation can be used. If a system which relies upon ionic polymerization is used, the photoinitiator may be the anion or cation generating type, depending on the nature of the polymerization.

Examples of photoinitiators useful in the present invention include diaryl ketone derivatives and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones, polycyclic quinones, benzophenones, substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of photoinitiators. For ultraviolet sensitivity one desirable combination is 2,2'-dimethoxy-2-phenylacetophenone, isopropylxanthone and ethyl para-dimethylaminobenzoate. It has been found particularly desirable to use an initiator system including an aromatic ketone and a dialkylaniline such as dimethylaniline or derivatives thereof.

The amount of photoinitiator used in the photosensitive composition will depend on the particular photosensitive material selected and the film speed desired. The photoinitiator may be used to sequester oxygen which is present in the microcapsules and inhibits photopolymerization. In this case a non-imaging, oxygen sequestering pre-exposure or co-exposure is used.

The imaging material of the present invention can be used to form dye, toner or pigment images, however, a preferred example of an image-forming agent is colorless electron donating compounds which form color by reacting with a developer material. Representative examples of such compounds include substantially colorless compounds having a lactone, a lactam, a sultone, a spiropyran, an ester or an amido structure in their partial skeleton such as triarylmethane compounds, bisphenylmethane compounds, xanthene compounds, fluorans, thiazine compounds, spiropyran compounds and the like. Crystal Violet Lactone and Copikem X, IV, XI, and XX and Experimental Cyan (products of Hilton-Davis Co.) and BASF Reakt Yellow are often used alone or in combination as color precursors in the present invention.

The developers used with the aforementioned color formers can be selected from among the developers conventionally used in carbonless paper including acid clay, active clay, attapulgite, etc.; organic acids such as tannic acid, gallic acid, propyl gallate; aromatic carboxylic acids such as benzoic acid, p-tert-butylbenzoic acid, 4-methyl-3-nitrobenzoic acid, salicylic acid, 3-phenyl salicylic acid, 3-cyclohexyl salicylic acid, 3-tert-butyl-5-methyl salicylic acid, 3,5-di-tert-butyl salicylic acid, 3-methyl-5-benzyl salicylic acid, 3-phenyl-5-($\alpha$,$\alpha$-dimethylbenzyl)salicylic acid, 3-cyclohexyl-5-($\alpha$,$\alpha$-dimethylbenzyl)salicylic acid, 3-($\alpha$,$\alpha$-dimethylbenzyl)-5-methyl salicylic acid, 3,5-di-cyclohexyl salicylic acid, 3,5-di-($\alpha$-methylbenzyl) salicylic acid, 3,5-di-($\alpha$,$\alpha$-dimethylbenzyl)salicylic acid, 3-($\alpha$-methylbenzyl)-5-($\alpha$,$\alpha$-dimethylbenzyl) salicylic acid, 4-methyl-5-cyclohexyl salicylic acid, 2-hydroxy-1-benzyl-3-naphthoic acid, 1-benzoyl-2-hydroxy-3-naphthoic acid, 3-hydroxy-5-cyclohexyl-2-naphthoic acid and the like, and polyvalent metallic salts thereof such as zinc salts, aluminum salts, magnesium salts, calcium salts and cobalt salts as disclosed in U.S. Pat. Nos. 3,864,146; 3,924,027 and 3,983,292; phenol compounds such as 6,6'-methylenebis-(4-chloro-m-cresol) as disclosed in Japanese Patent Publications Nos. 9,309 of 1965 and 20,144 of 1967, and Japanese Laid Open Patent Publication No. 14,409 of 1973; phenol resins such as phenol-aldehyde resins e.g., p-phenyl-phenol-formaldehyde resin and phenolacetylene resins, e.g., p-tert-butylphenol-acetylene resin, and polyvalent metallic salts thereof such as zinc modified phenyl formaldehyde resin as disclosed in U.S. Pat. No. 3,732,120; acid polymers such as maleic acid-rosin resin and copolymers of maleic anhydride with styrene, ethylene or vinylmethylether; and aromatic carboxylic acid-aldehyde polymers, aromatic carboxylic acid-acetylene polymers and their polyvalent metallic salts as disclosed in U.S. Pat. Nos. 3,767,449 and 3,772,052.

In addition to the color former-developer system, images can also be formed by encapsulating a chelating agent which reacts with a metal salt to generate a color image. Some typical examples of useful image-forming pairs of this type are nickel nitrate and N,N' bis(2- octanoyloxyethyl)-dithiooxamide, and alum [Fe(III)] and yellow prussiate.

Colored image-forming agents such as certain dyes and pigments can also be used in the present invention provided they do not detrimentally interfere with exposure of the photosensitive composition.

For a two-color system of the present invention, it is necessary to select the two image colors such that one of the colors is a component of the other. Cyan can be used with magenta to produce a blue mixed image and a cyan or magenta image. Cyan can be used with yellow to provide a green mixed image and a cyan or yellow image. Yellow can be used with magenta to give a red mixed image and a magenta or yellow image. Magenta can be used with green to provide a black mixed image and a magenta or green image. Black can be used with any color.

When the microcapsules include a chromogenic image-forming agent, i.e., an agent which reacts with another material to form a color, the photosensitive material can be a transfer material of the type described in U.S. Pat. No. 4,399,209 or a self-contained material of the type described in U.S. Pat. No. 4,440,846.

The microcapsules may also include a diluent oil. Inclusion of the oil will often improve mid tone gradation. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

Representative examples of photoactivatable inhibitors useful with photohardenable compositions to provide a negative working material include the following:

A. Nitroaromatic compounds in which the nitro group is ortho to a hydrogen-bearing alpha-carbon substituent. These compounds photochemically rearrange to nitrosoaromatic inhibitors of free radical polymerization upon exposure to radiation having a wavelength of about 200–400 nm. Representative examples include 2-nitro-4,5-dimethoxybenzaldehyde, 3-methoxy-2-nitrobenzaldehyde, 4-methoxy-2-nitrobenzaldehyde, 3,4-dimethoxy-2-nitrobenzaldehyde, 4-cyano-2-nitrobenzaldehyde, 6-nitroveratraldehyde, 6-nitropiperonal etc. Other examples of such o-nitroaromatic compounds are described in U.S. Pat. No. 4,198,242 which is herein incorporated by reference.

Nitroaromatic compounds are preferably used in combination with photoinitiators which have an active radiation absorption band with a molar extinction coefficient of at least 50 in the range of 400 to 600 nm, such as phenanthraquinones, and the ketocoumarins as reported in U.S. Pat. No. 4,147,552. They are preferably used in an amount of 0.001 to about 0.15 parts per part by weight of the photohardenable species in the photohardenable composition.

B. Nitroso dimers which are non-inhibitors of free-radical polymerization but thermally dissociate to nitroso monomers which inhibit free-radical polymerization. Typical examples of such compounds are described in U.S. Pat. No. 4,168,982, which is incorporated herein by reference. In general, these nitroso dimers have nitroso groups attached to primary or secondary aliphatic or alicyclic carbon atoms, to a six-membered aromatic ring or to the beta carbon atom of a vinyl group attached to a six-membered aromatic ring. Representative examples include 1-nitrosooctadecane dimer, nitrosocyclohexane dimer, nitrosododecane dimer, 2-nitroso-2,4-dimethyl-3-pentanone dimer, di-t-butylnitrosomethane dimer, and the like. These compounds are converted to inhibitors upon exposure to infrared radiation or heat or ultraviolet radiation and are preferably used in an amount of 0.1 to 10 parts per 100 parts of the photohardenable composition. These compounds can be incorporated into microcapsules to provide an imaging system which is useful in forming negative images by first exposing the microcapsules to infrared radiation such as emitted by an infrared laser. Thereafter, the microcapsules can be uniformly exposed to visible or ultraviolet radiation which image-wise photohardens the internal phase.

C. Bis(substituted amino) monosulfides or polysulfides. Typical examples are bis(substituted amino)sulfides which are substituted with alkyl groups containing 1 to 12 carbon atoms and the like. Examples of such compounds are described in U.S. Pat. No. 4,168,981, which is incorporated herein by reference. Representative examples include bis(2,2,6,6-tetramethylpiperidino) disulfide, bis(dicyclohexylamino)-disulfide, bis(diphenylamino)disulfide, bis(piperidino)-disulfide, bis(morpholino)disulfide, bis(piperidino) trisulfide, and bis(4-oxo-2,2,6,6-tetramethylpiperidino) tetrasulfide. These compounds generate radicals upon heating which inhibit free radical polymerization.

Photosensitive microcapsules having discrete walls are formed using conventional techniques such as coacervation, liquid-liquid phase separation, interfacial polymerization and the like. Various melting, dispersing and cooling methods may be used to form open phase systems.

The photosensitive compositions are usually oleophilic and encapsulated in hydrophilic wall-forming materials such as gelatin-type materials (see U.S. Pat. Nos. 2,730,456 and 2,800,457 to Green et al) including gum arabic, polyvinyl alcohol, carboxymethylcellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamineformaldehyde resin and hydroxypropyl cellulose (see commonly assigned U.S. Pat. No. 4,025,455 to Shackle).

The imaging material of the present invention can be exposed using various techniques. The simplest technique is to expose the sheet sequentially through different photomasks to different intensities of radiation or to expose for different times to the same intensity radiation. The preferred technique, however, would be to expose the sheet using an intensity modulated or time modulated radiation source such as a laser (e.g., a HeCd laser) or cathode ray tube. A Dunn or matrix camera could also be used.

The imaging material is developed by subjecting the microcapsules to a uniform rupturing force. This can be accomplished by passing the sheet through a nip on a calender press. Alternatively, certain abrasive actions can be used to rupture the capsules. For example, self-contained sheets can be developed by passing the sheet through a vibrating bed of free particles or by contacting the surface of the sheet with a soft brush or a magnetic brush of the type used to coat electrostatic drums with toner.

The present invention is illustrated in more detail by the following examples wherein the microcapsules were prepared by the following procedure:

Capsule Preparation

1. Into a 400 ml stainless steel beaker, 110 g water and 24.9 g isobutylene maleic anhydride copolymer (18%) are weighed.

2. The beaker is clamped in place on a hot plate under an overhead mixer. A six-bladed, 45° pitch, turbine impeller is used on the mixer.

3. After thoroughly mixing, 3.1 g pectin is slowly sifted into the beaker. This mixture is stirred for 20 minutes.

4. The pH is adjusted to 4.0 using a 20% solution of $H_2SO_4$, and 0.1 g Quadrol (2-hydroxypropyl ethylenediamine with propylene oxide from BASF) is added.

5. The mixer is turned up to 3000 rpm and the internal phase is added over a period of 10–15 seconds. Emulsification is continued for 10 minutes.

6. At the start of emulsification, the hot plate is turned up so heating continues during emulsification.

7. After 10 minutes, the mixing speed is reduced to 200o rpm and 16.6 g urea solution (50% w/w), 0.8 g resorcinol in 5 g water, 21.4 g formaldehyde (37%), and 0.6 g ammonium sulfate in 10 ml water are added at two-minute intervals.

8. The beaker is covered with foil and a heat gun is used to help bring the temperature of the preparation to 65° C. When 65° C. is reached, the hot plate is adjusted to maintain this temperature for a two to three hour cure time during which the capsule walls are formed.

9. After curing, the heat is turned off and the pH is adjusted to 9.0 using a 20% NaOH solution.

10. Dry sodium bisulfite (2.8 g) is added and the capsule preparation is cooled to room temperature.

EXAMPLE 1

Two capsule sets were produced, as outlined above containing the following internal phase:

| High Speed Microcapsule A | |
|---|---|
| TMPTA | 50 g |
| 7-Diethyl-3-cinnamoyl coumarin | 0.3 g |
| Ethyl-p-dimethylaminobenzoate (Ward-Blenkinsop Ltd.) | 2.0 g |
| Reakt Yellow (BASF) | 2.5 g |
| Experimental Cyan (Hilton Davis Chemical Co.) | 5.0 g |
| Quanticure BMS (Ward-Blenkinsop) | 6.0 g |
| Low Speed Microcapsule B | |
| TMPTA | 50 g |
| 7-Diethyl-3-cinnamoyl coumarin | 0.3 g |
| Ethyl-p-dimethylaminobenzoate | 2.0 g |
| Copikem XX (Hilton-Davis Chemical Co.) | 10 g |
| The following mixture was then prepared: | |
| Type A emulsion | 5 parts |
| Type B emulsion | 10 parts |
| 5% Klucel L (Hercules, Inc.) | 7.5 parts |
| Water | 7.5 parts |

The mixture was coated on 80 lb. Black and White Enamel Stock (The Mead Corporation) with a #12 Meyer bar. The dried sample was placed on a turntable and rotated at 33 rpm. Light from a Liconix Model 14200 PS He-Cd laser (443 nm) was focused to 0.25 cm (dia.) and scanned rapidly across the sample to provide a time modulated exposure. After exposure, the imaging sheet was developed against an acid developer sheet with a pressure of 200 pli. Both capsule types were exposed when the laser scan rate was less than 410 cm/min. and a white background color was obtained. The faster Type A capsules were preferentially exposed at scan rate of 410 to 2070 cm/min. and a magenta color image was obtained. At higher scan rates, neither set of capsules was exposed and a black image was obtained.

EXAMPLE 2

Using the procedure outlined above, microcapsules were prepared having the following internal phases:

| High Speed Microcapsules (C) | |
|---|---|
| Photomer 4149 (Diamond Shamrock) | 50 gm |
| 7-Diethylamino-3-cinnamoyl coumarin | 0.06 gm |
| Ethyl-p-dimethylaminobenzoate | 2.0 gm |
| Copikem XX (Hilton-Davis Chemical Co.) | 6.0 gm |
| 6-Nitroveratraldehyde (Aldrich) | 0.7 gm |
| SF-50 (Union Carbide Corp.) | 1.67 gm |
| Desmodur N-100 (Mobay) | 3.33 gm |
| Lower Speed Microcapsules (D) | |
| Photomer 4949 (Diamond Shamrock) | 50 gm |
| 7-Diethylamino-3-cinnamoyl coumarin | 0.08 gm |
| Ethyl-p-dimethyaminobenzoate | 2.0 gm |
| Pergascript Black (Ciba-Geigy) | 1.5 gm |
| Experimental Cyan (Hilton-Davis) | 4.0 gm |
| Reakt Yellow (BASF) | 3.0 gm |
| 6-Nitroveratraldehyde (Aldrich) | 0.6 gm |
| SF-50 (Union Carbide Corp.) | 1.67 gm |
| Desmodur N-100 (Mobay) | 3.33 gm |

A coating composition was prepared containing:

| Type C Emulsion | 17 parts (dry weight) |
|---|---|
| Type D Emulsion | 51 parts (dry weight) |
| 5% Klucel | 2 parts |
| Pearl R Corn Starch (A.E. Staley Corp.) | 27 parts |
| PFAZ-321 (Ionac Chem. Corp.) | 3 parts |
| Water | 400 parts |

This mixture was coated on a sheet of 80 lb. Black and White Enamel Stock (The Mead Corporation) which had been precoated with an acid developer to provide a self-contained imaging sheet. The sheet was allowed to dry and exposed (350–390 nm) through a first mask for 25 seconds whereby inhibitor was generated in the C capsules. The first mask was then replaced with a second mask and exposure was carried out in the same manner for 90 seconds to generate inhibitor in the C and D capsules in the exposed areas. The second mask was removed and the sheet was then uniformly exposed for seven seconds at 430–490 nm. Upon development by pressure roller, a copy was obtained in which the images corresponding to the first exposure were magenta, the images corresponding to the second exposure were black, and the background areas were white.

Having described the invention in detail and by reference to preferred embodiments thereof, it will be apparent that modifications and variations are possible without departing from the scope of the appended claims.

What is claimed is:

1. A photosensitive material useful in forming images of two or more colors comprising a support having first and second photosensitive microcapsules having different film speeds on the surface thereof, said first microcapsules being more sensitive to predetermined actinic radiation than said second microcapsules; each of said first and second microcapsules including photosensitive compositions internal thereof which undergo a change in viscosity upon exposure to said radiation and having first and second image-forming agents respectively associated therewith, said first image-forming agent being different than said second image-forming agent; wherein said photosensitive material is capable of forming images of two or more colors by image-wise exposing said material to said predetermined actinic radiation at two distinct exposure intensities and/or times and subjecting said microcapsules to a uniform rupturing force whereupon said image-forming agents are image-wise released from said microcapsules and two or more image colors are obtained.

2. The photosensitive material of claim 1 wherein said first and second microcapsules have discrete capsule walls.

3. The photosensitive material of claim 2 wherein said first and second microcapsules contain photohardenable compositions.

4. The photosensitive material of claim 3 wherein at least one of said photohardenable compositions includes an ethylenically unsaturated compound and a photoinitiator.

5. The photosensitive material of claim 4 wherein said first and second image-forming agents are substantially colorless electron donating color formers.

6. The photosensitive material of claim 5 wherein one of said image colors is a component of the other of said image colors.

7. The photosensitive material of claim 6 wherein said photosensitive material additionally includes a layer of an electron accepting developer material, said developer material being provided on the same or a separate support.

8. The photosensitive material of claim 2 wherein said first and second microcapsules contain a photosoftenable composition.

9. The photosensitive material of claim 3 wherein said microcapsules additionally include a photoactivatable inhibitor of free radical addition polymerization and said material can be used in a positive-working or negative-working mode.

10. The photosensitive material of claim 9 wherein said photohardenable composition includes an ethylenically unsaturated compound and a photoinitiator.

11. The photosensitive material of claim 10 wherein said photoactivatable inhibitor is an o-nitroaromatic compound, a nitroso dimer, or a bis(substituted-amino) sulfide.

12. A method for forming images of two or more colors which comprises image-wise exposing an imaging sheet to a predetermined actinic radiation at a first and a second exposure intensity and/or time such that said first exposure is substantially quantitatively different than said second exposure; said imaging sheet comprising a support having first and second photosensitive microcapsules having different film speeds on the surface thereof, said first microcapsules being more sensitive to said predetermined actinic radiation than said second microcapsules, each of said first and second microcapsules including photosensitive compositions internal thereto which undergo a change in viscosity upon exposure to said radiation and having first and second image-forming agents respectively associated therewith, said first image-forming agent being different than said second image-forming agent; and subjecting said image-wise exposed sheet to a uniform rupturing force whereupon said image-forming agents are image-wise released from said first and second microcapsules.

13. The method of claim 12 wherein said first and second microcapsules have discrete walls.

14. The method of claim 13 wherein said first and second microcapsules contain photohardenable compositions.

15. The method of claim 14 wherein said photohardenable composition includes an ethylenically unsaturated compound and a photoinitiator.

16. The method of claim 15 wherein said first and second image-forming agents are substantially colorless electron donating color formers.

17. The method of claim 16 wherein one of said image colors is a component of the other of said image colors.

18. The method of claim 17 wherein said photosensitive material additionally includes a layer of an electron accepting developer material, said developer material being provided on the same or a separate support.

19. The method of claim 18 wherein said image-wise exposure is performed using a time or intensity modulated exposure source.

20. The method of claim 12 wherein said radiation is ultraviolet radiation.

21. A method for forming images of two or more colors which comprises image-wise exposing an imaging sheet to a predetermined actinic radiation at a first and a second exposure intensity and/or time such that said first exposure is substantially quantitatively different than said second exposure; said imaging sheet comprising a support having first and second photosensitive microcapsules having different film speeds on the surface thereof, said first microcapsules being more sensitive to said predetermined radiation than said second microcapsules, each of said first and second microcapsules including photohardenable compositions internal thereto containing a photoactivatable inhibitor and having first and second image-forming agents respectively associated therewith, said first image-forming agent being different than said second image-forming agent; uniformly exposing said imaging sheet to radiation at a different wavelength than said image-wise exposure so as to harden the photohardenable composition in areas not previously exposed; and subjecting said image-wise exposed sheet to a uniform rupturing force whereupon said image-forming agents are image-wise released from said first and second microcapsules.

22. The method of claim 19 wherein said first and second microcapsules have discrete walls.

23. The method of claim 20 wherein said photohardenable composition includes an ethylenically unsaturated compound and a photoinitiator.

24. The method of claim 21 wherein said first and second image-forming agents are substantially colorless electron donating color formers.

25. The method of claim 24 wherein one of said image colors is a component of the other of said image colors.

26. The method of claim 25 wherein said image-wise exposure is performed using a time or intensity modulated radiation source.

27. The method of claim 26 wherein said photosensitive material additionally includes a layer of an electron accepting developer material, said developer material being provided on the same or a separate support.

28. The method of claim 27 wherein said radiation is ultraviolet radiation.

29. The method of claim 19 wherein said exposure source is a laser.

30. The method of claim 25 wherein said radiation source is a laser.

31. The method of claim 21 wherein said photoactivatable inhibitor is a compound which, upon exposure to actinic radiation, generates a species which inhibits free radical polymerization.

32. The method of claim 31 wherein said photoactivatable inhibitor is an 0-nitroaromatic compound, a nitroso dimer or a bis (substituted amino) sulfide.

33. The photosensitive material of claim 9 wherein said photoactivatable inhibitor is a compound which, upon exposure to actinic radiation, generates a species which inhibits free radical polymerization.

* * * * *